United States Patent
Chang et al.

(10) Patent No.: US 9,461,750 B2
(45) Date of Patent: Oct. 4, 2016

(54) OPTICAL TRANSMITTER

(71) Applicant: Alcatel Lucent, Boulogne-Billancourt (FR)

(72) Inventors: Qingjiang Chang, Shanghai (CN); Zhensen Gao, Shanghai (CN)

(73) Assignee: Alcatel Lucent, Boulogne-Billancourt (FR)

( * ) Notice: Subject to any disclaimer, the term of this patent is extended or adjusted under 35 U.S.C. 154(b) by 85 days.

(21) Appl. No.: 14/379,972

(22) PCT Filed: Jun. 3, 2013

(86) PCT No.: PCT/IB2013/001343
§ 371 (c)(1),
(2) Date: Aug. 20, 2014

(87) PCT Pub. No.: WO2013/190376
PCT Pub. Date: Dec. 27, 2013

(65) Prior Publication Data
US 2015/0030324 A1 Jan. 29, 2015

(30) Foreign Application Priority Data
Jun. 19, 2012 (CN) .......................... 2012 1 0204168

(51) Int. Cl.
*H01S 5/00* (2006.01)
*H04B 10/516* (2013.01)
(Continued)

(52) U.S. Cl.
CPC ............. *H04B 10/516* (2013.01); *H01S 5/141* (2013.01); *H04B 10/506* (2013.01);
(Continued)

(58) Field of Classification Search
CPC H04B 10/516; H04B 10/506; H04B 10/572; H04J 14/08; H01S 5/141; H01S 5/06216; H01S 5/0654; H01S 3/1055
See application file for complete search history.

(56) References Cited

U.S. PATENT DOCUMENTS 5,077,816 A * 12/1991 Glomb .................. H01S 5/0687
372/108
5,113,066 A * 5/1992 Michel ..................... G01D 5/38
250/205

(Continued)

FOREIGN PATENT DOCUMENTS

| CN | 101257352 A | 9/2008 |
| CN | 101783707 A | 7/2010 |
| CN | 102349204 A | 2/2012 |

OTHER PUBLICATIONS

Shenping Li et al., "Self-Seeding of Fabry-Perot Laser Diode for Generating Wavelength-Tunable Chirp-Compensated Single-Mode Pulses with High-Sidemode Suppression Ratio", IEEE Photonics Technology Letters, Nov. 2000, pp. 1441-1443, vol. 12, No. 11.

(Continued)

*Primary Examiner* — Danny Leung
(74) *Attorney, Agent, or Firm* — Harness, Dickey & Pierce, P.L.C.

(57) ABSTRACT

The optical transmitter includes a FP-LD, generating multiple-longitudinal mode light wave. The FP-LD is also driven by an electrical signal, modulates the electrical signal to the multiple-longitudinal mode light wave, and outputts the modulated multiple-longitudinal mode light wave. An optical coupler, coupled with the FP-LD, is used for feeding the modulated multiple-longitudinal mode light wave from the FP-LD to a fiber Bragg grating. The fiber Bragg grating is for filtering the received multiple-longitudinal mode light wave according to a parameter, and feeding back the optical signal generated after being filtered to the optical coupler. The optical coupler divides the optical signal, thus making the optical signal oscillate between the FP-LD and the fiber Bragg grating to form a oscillation cavity, and outputs a single mode optical wave with constant wavelength and power.

14 Claims, 6 Drawing Sheets

(51) Int. Cl.
*H01S 5/14* (2006.01)
*H04B 10/50* (2013.01)
*H04B 10/572* (2013.01)
*H04J 14/08* (2006.01)
*H01S 3/1055* (2006.01)
*H01S 5/062* (2006.01)
*H01S 5/065* (2006.01)

(52) U.S. Cl.
CPC ............ *H04B 10/572* (2013.01); *H04J 14/08* (2013.01); *H01S 3/1055* (2013.01); *H01S 5/0654* (2013.01); *H01S 5/06216* (2013.01)

(56) References Cited

U.S. PATENT DOCUMENTS

| | | | | | |
|---|---|---|---|---|---|
| 5,134,624 | A * | 7/1992 | Ono | ...................... | H01S 5/4025 372/23 |
| 6,331,991 | B1 * | 12/2001 | Mahgerefteh | ....... | H01S 5/06213 372/25 |
| 6,674,782 | B2 * | 1/2004 | Roosen | .................. | H01S 3/083 372/19 |
| 6,763,197 | B1 * | 7/2004 | Hirano | .................... | H04J 14/08 398/191 |
| 6,795,607 | B1 * | 9/2004 | Archambault | ..... | H04B 10/0775 385/24 |
| 7,266,307 | B2 * | 9/2007 | Shpantzer | ........ | H04B 10/25137 398/155 |
| 7,468,997 | B2 * | 12/2008 | Jayaraman | ............. | A61B 3/102 372/20 |
| 7,813,046 | B2 * | 10/2010 | Taverner | .............. | G01C 19/721 359/629 |
| 7,912,372 | B2 * | 3/2011 | Lee | .................... | H04J 14/0226 398/66 |
| 7,929,584 | B2 * | 4/2011 | Zhang | .................. | H04B 10/572 372/26 |
| 7,936,991 | B2 * | 5/2011 | Sugawara | ............ | H04L 7/0075 398/58 |
| 8,290,370 | B2 * | 10/2012 | Lee | ...................... | H04B 10/506 398/68 |
| 8,320,763 | B2 * | 11/2012 | Kim | ...................... | G02B 6/1221 398/68 |
| 8,326,151 | B2 * | 12/2012 | Lee | ...................... | H04B 10/564 398/68 |
| 8,774,630 | B2 * | 7/2014 | Lin | ...................... | H04B 10/506 359/337 |
| 8,861,963 | B2 * | 10/2014 | Lee | ...................... | H04B 10/506 398/68 |
| 8,971,709 | B2 * | 3/2015 | Liu | .................... | H04B 10/2503 398/67 |
| 8,983,307 | B2 * | 3/2015 | Byun | ................... | H04B 10/572 398/186 |
| 2015/0030324 | A1 * | 1/2015 | Chang | .................... | H04J 14/08 398/35 |

OTHER PUBLICATIONS

Jong Hoon Lim et al. "External Cavity Laser With High-Sidemode Suppression Ratio Using Grating-Assisted Directional Coupler", IEEE Photonics Technology Letters, Nov. 2005, pp. 2430-2432, vol. 17, No. 11.

Chien-Hung Yeh et al., "Using four wavelength-multiplexed self-seeding Fabry-Perot lasers for 10 Gbps upstream traffic in TDM-PON", Optics Express, Nov. 2008, pp. 18857-18862, vol. 16, No. 23.

Chien-Hung Yeh et al.. "Cost-effective wavelength-tunable fiber laser using self-seeding Fabry-Perot laser diode", Optics Express, Jan. 2008, pp. 435-439, vol. 16, No. 1.

International Search Report PCT/ISA/210 for International Application No. PCT/IB2013/001343 Dated Jun. 3, 2013.

\* cited by examiner

OPTICAL TRANSMITTER

TECHNICAL FIELD

The invention relates to optical access network, especially relates to the optical transmitter in the field of optical access network.

BACKGROUND TECHNOLOGY

Figure 1:
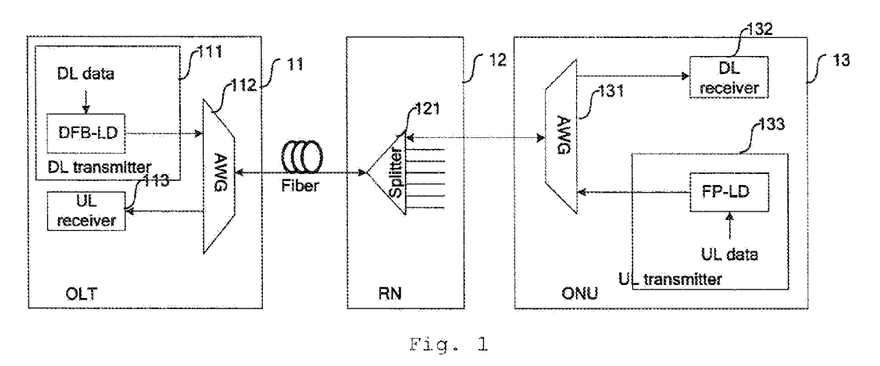
FIG. 1 shows the system topology diagram of an existing TDM-PON, wherein, it's based on FP-LD at the ONU side.

In current TDM-PON system, FP-LD (Fibry-Perot laser diode, also called Fibry-Perot semiconductor laser) is extensively used as a transmitter of an optical network unit (ONU), due to low cost, easy operation and simple manufacturing process, as shown in FIG. 1. FIG. 1 shows an optical line terminal 11 (OLT, which a local device), a remote node 12 (RN) and an optical network unit 13 (ONU, which is terminal device). Wherein, the optical line terminal 11 comprises a downlink transmitter 111, an uplink receiver 113, and an arrayed waveguide grating (AWG) 112. The remote node includes optical splitter 121. The optical network unit 33 comprises an arrayed waveguide grating 131, a downlink receiver 132 and an uplink transmitter 133.

However, the multimode characteristic of FP-LD limits its application. Generally speaking, the modulation rate of FP-LD is less than or equal to 2.5 Gb/s, and the transmission distance is less than or equal to 10 km. Therefore, for 10G TDM-PON system, or the transmission distance is more than 10 km, FP-LD is not suitable. Thus, a high-performance and high-cost DFB-LD (distributed feedback laser diode) laser is required to directly modulate downlink or uplink data at OLT end or at ONU end. In order to reduce the cost of the TDM-PON system, it is desirable to use low-cost FP-LD to realize high modulation rate and longer transmission distance like DFB-LD laser.

External optical injection is an effective method to improve FP-LD transmission characteristic, such as improving modulation bandwidth, reducing nonlinear distortion, reducing mode partition noise, reducing chirp, and outputting a single-mode optical wave with constant power and high side mode suppression ratio.

Figure 2:
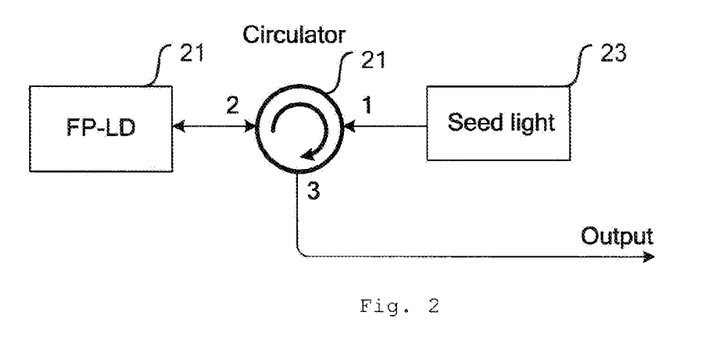
FIG. 2 shows the schematic diagram of existing improved FP-LD based on an external injection seed source.

FIG. 2 shows an external injection locking mode of the FP-LD 21. The injected laser forces the multimode FP-LD 21 to operate in a quasi single mode, and suppresses mode partition noise. In this way, the external optical signal acts as a seed light 23 to oscillate in a FP cavity via a circulator 21, therefore the nearest mode to the peak wavelength of the injected signal will be locked to the injected light, and other modes will be suppressed. Finally, the FP-LD 21 can produce a single longitudinal mode (SLM) output with a constant power, which has nearly the same transmission performance as DFB-LD.

However, the solution has the following disadvantages:

1. if the scheme is applied to an ONU, external injection locking mode requires an additional light source at each ONU, thus adding system cost.
2. in the existing system, external injection light source is considered as an independent device, thus it is not easy to integrate the device into an ONU module unit.
3. the external seed light source is an active component, and it needs to control its on/off state.

Therefore, the solution is not feasible that employing external injection locking mode to improve FP-LD characteristic to achieve a better transmission feature in an actually realized TDM-PON system.

In addition, as a large number of new advanced multimedia applications appear, such as the service deployment of 3D TV, remote medical services, online games, interactive video electronic learning etc., there has been a great increase in the need of the network bandwidth bearing these applications. NG-PON2 (Next Generation Passive Optical Network) becomes a hot topic in ITU-T (Telecommunication Standardization Sector of the International Telecommunications Union) and FASN (Full Service Access Network). Most operators expect NG-PON2 to provide more bandwidth, higher optical divide ratio, longer transmission distance and greater access capability. Currently, both of FSAN and ITU-T determine their need of NG-PON2, to improve the available bandwidth to a rate of up to 40 Gb/s.

Among all the candidate technical solutions, TWDM-PON (Time Wavelength Division Multiplexing) has been considered as a primary solution for NG-PON2 in recent FSAN meeting, wherein 4 XG-PONs (that's 40G PON) are stacked by four 10G GPON, and the typical optical divide ratio is 1:64, thereby achieving an aggregate rate of 40 Gbps in downstream and 10 Gbps in upstream. In a single wavelength, TWDM-PON reuses XG-PON (that's 10G PON) downstream multiplexing and upstream access technology, timeslot granularity, multicast capability, and bandwidth allocation mechanism.

In TWDM-PON access, an ONU transmitter must be able to adjust any of four upstream wavelengths. Thus, it is need to design a low-cost ONU transmitter with tunable wavelength to reduce the cost of 40G TWDM-PON.

Figure 3:
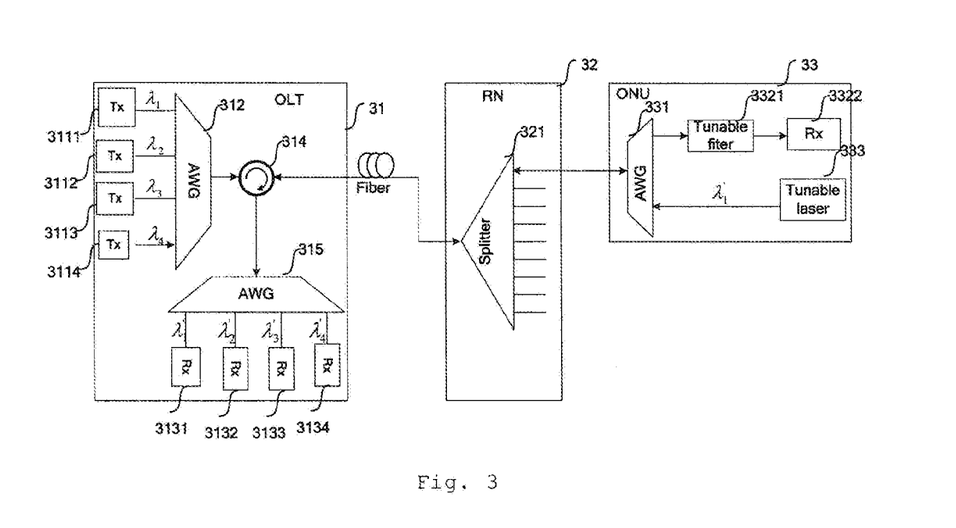
FIG. 3 shows the diagram of an existing tunable laser at the ONU side.

Tunable wavelength technology is an effective scheme to realize an tunable ONU transmitter, wherein, the tunable laser is used in an uplink signal transmitter, shown as FIG. 3. FIG. 3 shows an optical line terminal 31, a remote node 32 and an optical network unit 33. Wherein, the optical line terminal 31 comprises transmitters 3111-3114, uplink receivers 3131-3134, arrayed waveguide grating 312 and 315, and circulator 314. The remote node includes an optical splitter 321. The optical network unit 33 comprises an arrayed waveguide grating 331, a tunable filter 3321, a receiver 3322 and a tunable laser 333.

However, the tunable laser is a very expensive device. Especially, NG-PON2 needs to support the optical divide ratio of more than or equal to 1:64, and this means at least 64 tunable lasers are needed in a ONU transmitter, which will lead to an enormous cost for realization, and thus inevitably limits the large scale deployment of TWDM-PON system.

SUMMARY OF THE INVENTION

The invention concerns to design a tunable/fixed wavelength ONU transmitter with low cost based on self-injection FP-LD laser. The basic idea of the invention is: an optical coupler cascaded with a FBG or tunable FBG is directly integrated in a commercial ordinary FP-LD to form a feedback cavity. The FBG or tunable FBG maybe used as an optical filter, to select a dedicated longitudinal mode in the optical spectrum outputted from the original FP-LD. Besides, the FBG or tunable FBG may also be used as an optical feedback device. Thus, the selected longitudinal mode will be fed back to the original FP-LD by the FBG or tunable FBG. For a tunable FBG, the FP-LD can generate a single longitudinal mode output with a constant power of different wavelength, by adjusting the central wavelength of the reflection optical spectrum of the tunable FBG. Based on the self-injection FP-LD technology, it can directly adjust the wavelength needed by the FP-LD output, by dynamically controlling the central wavelength of the tunable FBG, thereby achieving a tunable uplink optical transmitter.

The invention proposes an optical transmitter, comprising a FP-LD, for generating multiple-longitudinal mode light wave, wherein the FP-LD is also driven by an electrical signal, modulating the electrical signal to the multiple-longitudinal mode light wave, and outputting the modulated multiple-longitudinal mode light wave; an optical coupler, coupled with the FP-LD, wherein the coupler is used for feeding the modulated multiple-longitudinal mode light wave from the FP-LD to a fiber Bragg grating; the fiber Bragg grating is for filtering the received multiple-longitudinal mode light wave according to a predetermined parameter, and feeding back the optical signal generated after being filtered to the optical coupler; the optical coupler divides the optical signal, thus making the optical signal oscillate between the FP-LD and the fiber Bragg grating to form a oscillation cavity, and outputs a stable single mode optical wave.

According to an aspect of the invention, an optical transmitter in TDM-PON is provided, comprising: a FP-LD, generating multiple-longitudinal mode light wave, wherein the FP-LD is also driven by an electrical signal, modulating the electrical signal to the multiple-longitudinal mode light wave, and outputting the modulated multiple-longitudinal mode light wave; an optical coupler, coupled with the FP-LD, wherein the coupler is used for feeding the modulated multiple-longitudinal mode light wave from the FP-LD to a fiber Bragg grating; the fiber Bragg grating is for filtering the received multiple-longitudinal mode light wave according to a predetermined parameter, and feeding back the optical signal generated after being filtered to the optical coupler; the optical coupler is for dividing the optical signal to a first branch optical signal and a second branch optical signal, wherein, the first branch optical signal is fed back to the FP-LD, and the second branch optical signal is fed to a detector; the detector is used for judging whether the wavelength and power of the second branch optical signal meet a predetermined condition; when the predetermined condition is not met, the FP-LD reflects the first branch optical signal to the optical coupler, and the optical coupler, the fiber Bragg grating, the optical coupler and the detector in turn repeat respectively the operations of the feeding, the filtering and feedback, the dividing and the judging; when the predetermined condition is met, the output port of the second branch optical signal is an output port of the optical transmitter.

According to a second aspect of the invention, an optical transmitter in 40G TWDM-PON is provided, comprising: a. FP-LD, for generating and outputting multiple-longitudinal mode light wave, wherein the FP-LD is also driven by an electrical signal, and modulating the electrical signal to an optical carrier; an optical coupler, coupled with the FP-LD, wherein the coupler is used for feeding the multiple-longitudinal mode light wave from the FP-LD to a fiber Bragg grating with tunable wavelength; the fiber Bragg grating with tunable wavelength is for filtering the received multiple-longitudinal mode light wave according to a predetermined parameter, and feeding back the optical signal generated after being filtered to the optical coupler; the optical coupler is for dividing the optical signal to a first branch optical signal and a second branch optical signal, wherein, the first branch optical signal is fed back to the FP-LD, the second branch optical signal is fed to a detector; the detector is used for judging whether the wavelength and power of the second branch optical signal meet a predetermined condition; when the predetermined condition is not met, the FP-LD reflects the first branch optical signal to the optical coupler, and the optical coupler, the fiber Bragg grating with tunable wavelength, the optical coupler and the detector in turn repeat respectively the operations of the feeding, the filtering and feedback, the dividing and the judging; when the predetermined condition is met, the detector outputs the second branch optical signal to an output port of the optical transmitter; wherein, the optical transmitter further includes a controller, the controller is used for receiving a control signal from a optical line terminal, and adjusting the predetermined parameter of the fiber Bragg grating with tunable wavelength according to the control signal.

According to a third aspect of the invention, a 40G time and wavelength multiplexing passive optical network (TWDM-PON) is provided, comprising a optical line terminal, a remote node coupled with the optical line terminal via a fiber, and an optical network unit coupled with the remote node, wherein, the optical network unit comprises an arrayed waveguide grating coupled with the remote node, a downlink receiver coupled with the arrayed waveguide grating and an optical transmitter according to the second aspect of the invention coupled with the arrayed waveguide grating, wherein, the optical line terminal is for transmitting an control signal to the optical transmitter, which is used to adjust the predetermined parameter of the fiber Bragg grating with tunable wavelength, wherein, the predetermined parameter represents the central wavelength of the fiber Bragg grating; the optical transmitter is for adjusting the predetermined parameter of the fiber Bragg grating with tunable wavelength, according to the control signal.

The invention proposes a novel ONU or OLT transmitter with low cost based on a self-injection FP-LD, in order to reduce the access cost of TDM-PON and 40G TWDM-PON. In the invention, the (tunable) FBG of millimeter level is used to achieve the function of filtering and reflecting at the same time, while not needing additional optical filter. Finally, the (tunable) FP-LD can generate a single longitudinal mode with a constant power, which has a performance almost same as the performance of an tunable laser.

Besides, the length of the feedback cavity between a FP-LD and (tunable) FBG is about 10 mm, thus it's very easy to integrate the feedback cavity to an ordinary FP-LD component. In addition, the cost of an optical coupler and FBG is extremely low.

Thus, the embodiments of the invention, used in a TDM-PON and 40G TWDM-PON, have the following technical effect.

low cost:

1. for a TDM-PON system: the price of a 2.5 GHz commercial DFB-LD is about 20US$; while the price of a 2.5G commercial FP-LD is about 10$, and the price of a FBG and optical coupler is extremely low. Thus, for a TDM-PON system with 64 ONUs, the total system cost may be saved by up to 600$.

2. for a 40G TWDM-PON system: current commercial FP-LD may be used an tunable transmitter of a 40G TWDM-PON. Generally speaking, the price of a 2.5G tunable laser in an ONU is about 200$, while the price of a 2.5G commercial FP-LD is about 10$, and the cost of an tunable FBG and optical coupler is about 90$. Thus, for a TWDM-PON system with 64 ONUs, the total system cost may be saved by up to 6400$.

easy to integrate: an (tunable) FBG is used to filter and reflect, and it's a size of millimeter level. The length of the feedback cavity between a FP-LD and (tunable) FBG is about 10 mm, thus it's very easy to integrate the FBG and the optical coupler to an ordinary commercial FP-LD component.

easy to implement: in the implementation, a common FP-LD can be integrated with a feedback cavity, as a new FP-LD module. The technician only needs to replace the old FP-LD with the new FP-LD, without needing to change other modules in an ONU.

BRIEF DESCRIPTION OF THE DRAWING

By reading the following detailed description of non-limiting embodiments referring to the attached drawings, other features, purposes and advantages of the invention will become clearer.

Wherein, the same or similar reference signs represent the same or similar step features or apparatuses/modules.

DETAILED DESCRIPTION OF EMBODIMENTS

Figure 4:
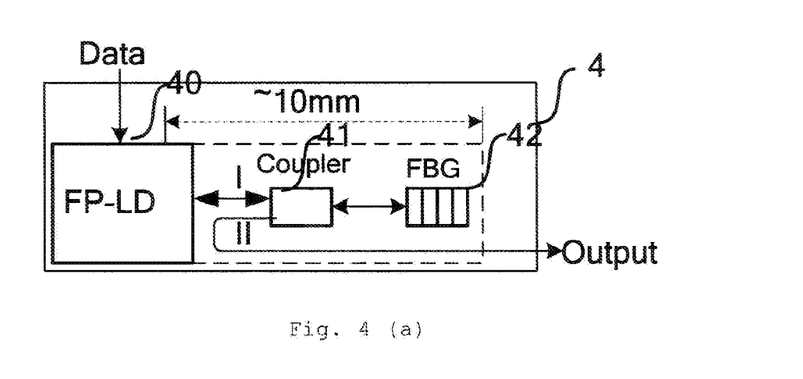
FIG. 4(a) shows the diagram of a FP-LD optical transmitter with self-excitation function according to an embodiment of the invention.
FIG. 4(b) shows a FP-LD spectrum diagram without self-excitation function.
FIG. 4(c) shows the spectrum diagram of a self-excited FP-LD based on a FBG feedback cavity according to an embodiment of the invention.

—The First Embodiment:

The architecture of the TDM optical transmitter 4 is proposed, according to an embodiment of the invention. The architecture comprises three parts, as shown in FIG. 4 (a), 1) the commercial FP-LD 40, as the original optical source, which has multi-longitudinal-mode (MLM) output;

2) the 1:2 optical coupler 41, and its optical divide ratio is 5%:95%. The part of 95% ratio is used as an output port, and the part of 5% ratio is used to feed to a FBG. The optical coupler is just for dividing and combining optical power: the signal content is completely the same, and only the magnitude of optical power is different. The optical divide ratio of optical power in the embodiment is 5%:95%. Certainly, the above ratio of 5%:95% is used just as an example, and the technicians of this field may adjust the ratio according to actual need.

3) the FBG 42, used as an optical filter device and an optical reflection device at the same time. It can be used to select a specified SLM, and transmit the selected SLM to the original FP-LD. Thus, the optical coupler 41 cascaded with the FBG 42 can be directly integrated to the commercial FP-LD 41, to form a feedback cavity of 10 mm length, to be used in the self-injection locked mode.

In detail, the FP-LD 40 generates multiple-longitudinal mode light wave, the FP-LD is also driven by an electrical signal (i.e., the data in FIG. 4(a)), modulates the electrical signal to the multiple-longitudinal mode light wave, and outputs the modulated multiple-longitudinal mode light wave to the coupler 41;

The optical coupler 41 couples with the FP-LD 40, and the coupler is used for feeding the modulated multiple-longitudinal mode light wave from the FP-LD 40 to a fiber Bragg grating (FBG for short) 42;

The fiber Bragg grating 42 is for filtering the received multiple-longitudinal mode light wave according to a predetermined parameter, and feeding back the generated optical signal after being filtered to the optical coupler 41;

The optical coupler 41 is for dividing the optical signal to a first branch optical signal I and a second branch optical signal II, wherein, the first branch optical signal I is fed back to the FP-LD 40, and the second branch optical signal is fed to a detector (not shown in the figure). The optical signal emitted by the FP-LD goes to the FBG through the coupler 41, without being combined or divided; the optical signal reflected by the FBG is divided by the coupler 41 into the first branch I and the second branch II, wherein the first branch is fed to the FP-LD, and the second branch is connected to a detector.

The detector is generally a spectrometer and optical power meter, which is used for judging whether the wavelength and power of the second branch optical signal II meet a predetermined condition. The predetermined condition comprises that a single wavelength optical signal with a stable wavelength and power is outputted by the second branch optical signal.

When the predetermined condition is not met, the FP-LD 40 reflects the first branch optical signal to the optical coupler 41, then the optical coupler 41 implements the operations of the feeding, the fiber Bragg grating 42 implements the operations of the filtering and feedback, the optical coupler 41 implements the operations of the dividing, and the detector implements the operations of the judging;

When the predetermined condition is met, the output port of the second branch optical signal II is an output port of the optical transmitter, e.g. when the second branch optical signal II outputs a single wavelength optical signal with a stable wavelength and power, the output port of the second branch optical signal II is an output port of the optical transmitter.

Therefore, in the embodiment, the feedback light is selected by a FBG and propagated in the following optical path: FP-LD 40→optical coupler 41→FBG 42→optical coupler 43→FP-LD 40→optical coupler 41→FBG 42→ . . . another output of the optical coupler.

A laser cavity is formed between a FP-LD and a FBG, and only the optical wavelength in the FBG reflection spectrum will be oscillated to implement a single mode operation.

The FP-LD original spectrum without self-injection is shown in FIG. 4(b). Based on the filtering and reflecting function of a FBG, the FP-LD will excite a single longitudinal mode, and the output of the single longitudinal mode will be amplified by a self-injection operation, without an expensive optical source of external injection, and the FP-LD feeds back by itself and is stably locked to the position of the FBG central wavelength by the reflected optical wave. Finally, the FP-LD outputs a single longitudinal mode with constant power, and it has almost the same transmission performance as the DFB laser. FIG. 4(c) shows the output spectrum of a FP-LD implementing self-feedback based on the proposed feedback device, wherein, the output signal mode has a good side-mode suppression ratio.

In the embodiment, the FBG is a main component implementing the FP-LD self-exciting. To match the existing TDM-PON wavelength plan (defined in ITU-T), the FBG central wavelength equals to 1310 nm in the uplink transmission, and 1490 nm in the downlink transmission. Besides, in the central wavelength, 3 dB width of the FBG is 0.6-1.0 nm, and the reflectivity is 99%. Based on the existing FBG manufacture process, these parameters are easy to obtain. The FBG has a filtering function, and 3 dB width is an essential parameter of the FBG, namely the filter window.

Figure 5:
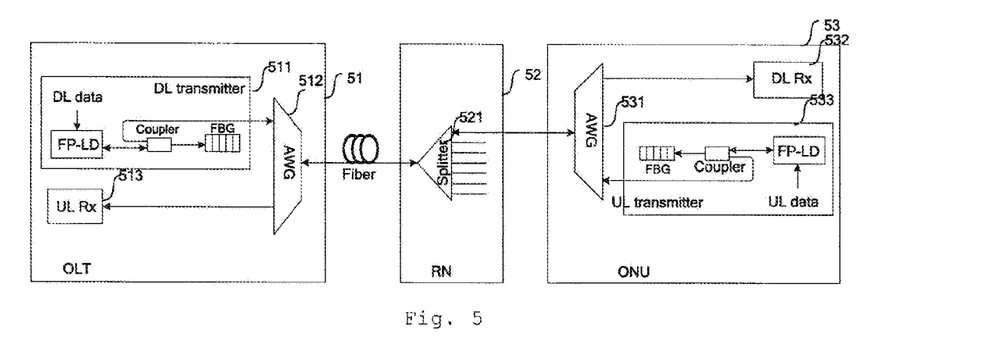
FIG. 5 shows the system architecture diagram of a TDM-PON according to an embodiment of the invention.

Based on the self-excited locked mode of the embodiment, the improved FP-LD transmitter can be deployed either in an OLT, or in an ONU, shown in FIG. 5. The FIG. 5 shows an optical line terminal 51, a remote node 52 and an optical network unit 53. Wherein, the optical line terminal 51 comprises a downlink transmitter 511, an uplink receiver 513, and an arrayed waveguide grating 512. The downlink transmitter 511 further comprises a FP-LD, a coupler and a FBG. The remote node includes optical splitter 521. The optical network unit 53 comprises an arrayed waveguide grating 531, a downlink receiver 532 and an uplink transmitter 533. Wherein, the uplink transmitter 533 comprises a FP-LD, a coupler and a FBG. As shown in FIG. 5, when the FBG is used in the downlink transmitter 511 according to the embodiment of the invention, the central wavelength of the FBG is 1490 nm. When the FBG is used in the uplink transmitter 533 according to the embodiment of the invention, the central wavelength of the FBG is 1310 nm.

When the improved FP-LD transmitter is deployed in an OLT or ONU, it may obtain a essentially same transmission performance as the DFB-LD, thereby achieving high modulation rate and long transmission distance.

Figure 6:
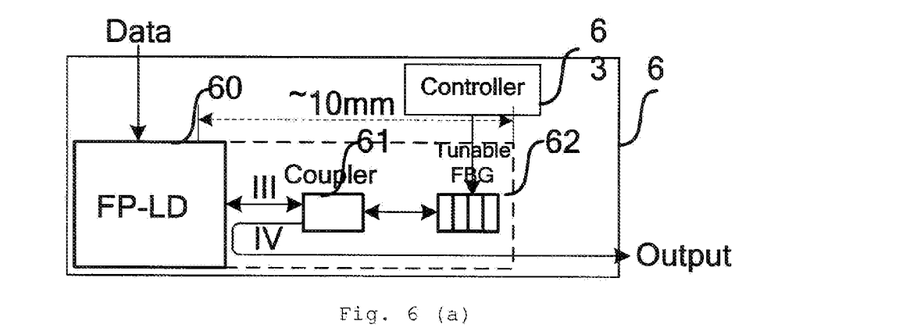
FIG. 6(a) shows the diagram of a FP-LD optical transmitter with self-excitation function according to another embodiment of the invention.
FIG. 6(b) shows a FP-LD spectrum diagram without self-excitation function.
FIG. 6(c) shows the spectrum diagram of a self-excited FP-LD based on an tunable FBG feedback cavity according to another embodiment of the invention.
Figure 7:
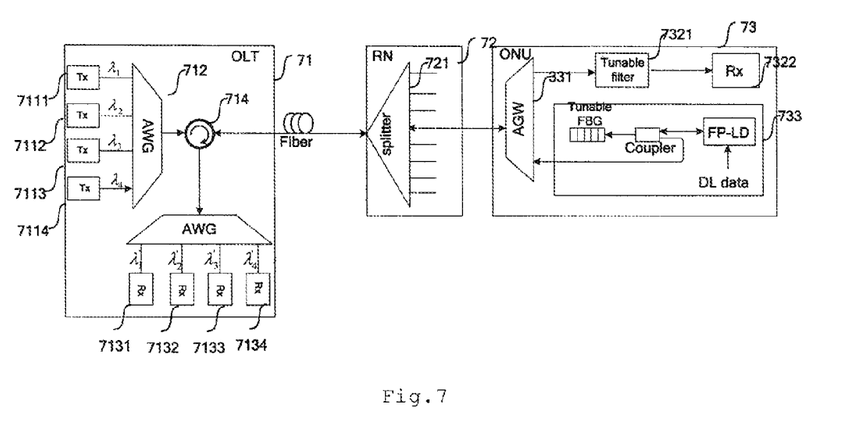
FIG. 7 shows the system architecture diagram of a 40G TWDM-PON according to an embodiment of the invention.

The Second Embodiment:

The following describes another embodiment of the invention, by referring to FIG. 6 and FIG. 7.

The architecture of the TWDM optical transmitter 6 is proposed, according to another embodiment of the invention. The architecture 6 comprises three parts, as shown in FIG. 6(a), 1) the commercial FP-LD 60, as the original optical source, which has multi-longitudinal-mode (MLM) output;

2) 1:2 optical coupler 61, and its optical division ratio is 5%:95%. The part of 95% ratio is used as an output port, and the part of 5% ratio is used to feed to a FBG. The optical coupler is only for dividing and combining optical power: and the signal content is completely the same, and only the magnitude of optical power is different. The optical division ratio of optical power in the embodiment is 5%:95%. Certainly the above ratio of 5%:95% is only used as an example, and the technicians of the field may adjust this ratio according to actual need.

3) the FBG 62, used as an optical filter device and an optical reflection device at the same time. It can be used to select a specified SLM, and transmit the selected SLM to the original FP-LD. Thus, the optical coupler 61 cascaded with the FBG 62 can be directly integrated to the commercial FP-LD 61, to form a feedback cavity of 10 mm length, to be used in the self-feedback locked mode.

In detail, the FP-LD 60 generates multiple-longitudinal mode light wave, the FP-LD is also driven by an electrical signal (i.e., the data in FIG. 6(a)), modulates the electrical signal to the multiple-longitudinal mode light wave, and outputs the modulated multiple-longitudinal mode light wave to the coupler 61;

The optical coupler 61 couples with the FP-LD 60, the coupler is used for feeding the modulated multiple-longitudinal mode light wave from the FP-LD 60 to a fiber Bragg grating (FBG) 62;

The fiber Bragg grating 62 is for filtering the received multiple-longitudinal mode light wave according to a predetermined parameter, and feeding back the optical signal generated after being filtered to the optical coupler 61;

The optical coupler 61 is for dividing the optical signal to a first branch optical signal III and a second branch optical signal IV, wherein, the first branch optical signal III is fed back to the FP-LD 60, and the second branch optical signal IV is fed to a detector (not shown in the figure). For coupler 60, the optical signal emitted by the FP-LD goes to the FBG through the coupler 61, without being combined or divided; the optical signal reflected by the FBG is divided by the coupler 41 into the first branch III and the second branch IV, wherein the first branch III is fed to the FP-LD, the second branch IV is connected to a detector.

The detector are generally a spectrometer and an optical power meter, which is used for judging whether the wavelength and power of the second branch optical signal IV meet a predetermined condition. The predetermined condition comprises that a single wavelength optical signal with a stable wavelength and power is outputted by the second branch optical signal IV.

When the predetermined condition is not met, the FP-LD 60 reflects the first branch optical signal III to the optical coupler 61, then the optical coupler 61 implements the operations of the feeding, the fiber Bragg grating 62 implements the operations of the filtering and feedback, the optical coupler 61 implements the operations of the dividing and the detector implements the operations of the judging;

When the predetermined condition is met, the output port of the second branch optical signal IV is an output port of the optical transmitter, e.g. when the second branch optical signal IV outputs a single wavelength optical signal with a stable wavelength and power, the output port of the second branch optical signal IV is an output port of the optical transmitter;

Therefore, in the embodiment, the feedback light is selected by a FBG and propagated in the following optical path: FP-LD 60→optical coupler 6→tunable FBG 62→optical coupler 63→FP-LD α→optical coupler 61→FBG 62→ . . . another output of the optical coupler. A laser cavity is formed between a FP-LD and a FBG, and only the optical wavelength in the FBG reflection spectrum will be oscillated to implement a single mode operation.

Besides, controller 63 is used to receive the control signal from an OLT, and used to adjust the predetermined parameter of the fiber Bragg grating with tunable wavelength, according to the control signal.

In the invention, an tunable FBG needs to be able to change its central wavelength accurately. Once an ONU receives from an OLT a downlink control command about a specified wavelength channel, the control circuit in the ONU is triggered and adjusts the central wavelength of the tunable FBG. Thus, the output wavelength of multi-longitudinal-mode FP-LD is the same with the central wavelength of the tunable FBG. The filtered longitudinal mode will be reflected in the feedback device and returns to the FP-LD.

The original spectrum of FP-LD without self-injection is shown in FIG. 6(b). Based on the filtering and reflecting function of the tunable FBG, the FP-LD will excite a single longitudinal mode, and the output of the single longitudinal mode will be amplified by a self-injection operation. Without needing an expensive optical source of external injection, the FP-LD injects by itself and is stably locked to the wavelength generated by the FBG via the reflected optical wave. Finally, the FP-LD outputs a single longitudinal mode with constant power, and it has almost the same transmission performance with the tunable laser. FIG. 6(c) shows the output spectrum of a FP-LD implementing self-injection based on the proposed feedback device, which is obtained by adjusting the central wavelength of the reflection spectrum of the tunable FBG, wherein, 601-604 represent respectively that four single longitudinal modes with different wavelength can be obtained.

In the embodiment, the tunable FBG is a key component implementing the FP-LD self-injection. The tunable FBG accurately matches with the wavelength plan used in uplink transmission of the existing 40G TWDM-PON, through an optimized design. Besides, in the central wavelength, 3 dB width of the tunable FBG is about 0.6-1.0 nm, the reflectivity is 99%. These requirements are easy to meet through the existing FBG manufacture technique.

Based on the self-injection locking mode solution proposed by the invention, it may obtain a 40G TWDM-PON system with a low-cost tunable ONU transmitter, shown as FIG. 7. It should be understood, some control solution are needed, such as the control of temperature and wavelength, or the control of the wavelength based on the different stress applied by the FBG, to ensure that different ONUs can generate the same wavelength groups.

Besides, the step of adjusting wavelength of the fiber Bragg grating with tunable wavelength is 100 GHz or 200 GHz, with four adjusting steps in total. For the 100 GHz step, the range of adjusting wavelength is 0 to 400 GHz. And for the 200 GHz step, the range of adjusting wavelength is 0 to 800 GHz.

Besides, when locating in different optical network unit, the wavelength of the optical signal outputted by an optical transmitter may be either the same, or different.

The above describes the embodiments of the invention, but the invention is not limited to the specific systems, devices and detailed protocols. The technicians in the field may make various deformations or modifications in the scope of the appended claims. Those ordinary technicians of this technical field may understand and implement other changes to the disclosed embodiments, by studying the specification, disclosure, diagrams and the appended claims. In the claims, the word "comprise" doesn't exclude other components and steps, and the word "a" doesn't exclude plural. In the invention, "first", "second" only represent a name, not an order relation. In the actual application of the invention, a component may implement the functions of multiple technical features quoted by the claims. Any reference signs in the claims shouldn't be understood as a limitation to the scope.

What is claimed is:

1. An optical transmitter used for a time division multiplexing system, the optical transmitter comprising:
a Fabry Perot-Laser Diode (FP-LD) driven by an electric signal, the FP-LD configured to,
generate a multiple-longitudinal mode light wave,
modulate the electrical signal to the multiple-longitudinal mode light wave, and
output the modulated multiple-longitudinal mode light wave; and
an optical coupler coupled with the FP-LD, and configured to feed the modulated multiple-longitudinal mode light wave from the FP-LD to a fiber Bragg grating, wherein the fiber Bragg grating is configured to,
filter the received multiple-longitudinal mode light wave according to a parameter, and
feed back the filtered light wave to the optical coupler,
the optical coupler is configured to divide the filtered light wave into a first branch optical signal and a second branch optical signal, the first branch optical signal being fed back to the FP-LD, and the second branch optical signal being fed to a detector,
the detector is configured to judge whether a wavelength and a power of the second branch optical signal meet a condition,
when the condition is not met,
the FP-LD is configured to reflect the first branch optical signal to the optical coupler, and
the optical coupler, the fiber Bragg grating, the optical coupler and the detector are configured to repeat respectively the operations of feeding, filtering and feeding back, dividing and judging, and
when the condition is met, the second branch optical signal is provided as an output of the optical transmitter.

2. The optical transmitter of claim 1, wherein the parameter is the wavelength or a frequency of the light wave.

3. The optical transmitter of claim 2, wherein
the wavelength of the light wave is 1310 nm when the optical transmitter is configured to operate for uplink transmitting, or
the wavelength of the light wave is 1490 nm when the optical transmitter is configured to operate for downlink transmitting.

4. The optical transmitter of claim 1, wherein a 3 dB bandwidth of the fiber Bragg grating is between 0.6 nm to 1 nm.

5. The optical transmitter of claim 1, wherein the condition is that the second branch optical signal be a single wavelength optical signal with a stable wavelength and power.

6. The optical transmitter of claim 1, wherein the optical transmitter is in an optical line terminal or an optical network unit of the time division multiplexing system.

7. An optical transmitter of a time and wavelength division multiplexing system, the optical transmitter comprising:
a Fabry Perot-Laser Diode (FP-LD) driven by an electrical signal, the FP-LD configured to,
generate and output a multiple-longitudinal mode light wave, and, and
modulate the electrical signal to the multiple-longitudinal mode light wave; and
an optical coupler, coupled with the FP-LD, and configured to feed the modulated multiple-longitudinal mode light wave from the FP-LD to a fiber Bragg grating with tunable wavelength, wherein
the fiber Bragg grating is configured to,
filter the received multiple-longitudinal mode light wave according to a parameter, and
feed back the filtered light wave to the optical coupler;
the optical coupler is configured to divide the filtered light wave into a first branch optical signal and a second branch optical signal, the first branch optical signal being fed back to the FP-LD, and the second branch optical signal being fed to a detector,
the detector configured to judge whether a wavelength and a power of the second branch optical signal meet a condition, when the condition is not met,
the FP-LD is configured to reflect the first branch optical signal to the optical coupler, and
the optical coupler, the fiber Bragg grating with tunable wavelength, the optical coupler and the detector are configured to repeat respectively the operations of feeding, filtering and feeding back, dividing and judging,
when the condition is met, the second branch optical signal is provided as an output of the optical transmitter, and
the optical transmitter further includes a controller, the controller configured to,
receive a control signal from an optical line terminal, and
adjust the parameter of the fiber Bragg grating with tunable wavelength according to the control signal.

8. The optical transmitter of claim 7, wherein the controller is configured to adjust the parameter by adjusting a temperature or stress of the fiber Bragg grating with tunable wavelength.

9. The optical transmitter of claim 7, wherein the parameter is the wavelength or a frequency of the light wave.

10. The optical transmitter of claim 7, wherein a 3 dB bandwidth of the fiber Bragg grating with tunable wavelength is between 0.6 nm to 1 nm.

11. The optical transmitter of claim 7, wherein at least one of,
a step length of adjusting the wavelength of the fiber Bragg grating with tunable wavelength is 100 GHz or 200 GHz, and
the Bragg grating has four adjustable step lengths.

12. The optical transmitter of claim 7, wherein the wavelength of the output light wave of the optical transmitter conforms to an uplink signal wavelength plan of full service access networks (FSAN).

13. The optical transmitter of claim 7, wherein the optical transmitter is in the optical network unit of 40G time and wavelength division multiplexing system.

14. A time and wavelength multiplexing passive optical network, comprising:
an optical line terminal;
a remote node coupled with the optical line terminal via a fiber; and
an optical network unit coupled with the remote node, the optical network unit including,
an arrayed waveguide grating coupled with the remote node,
a downlink receiver coupled with the arrayed waveguide grating, and
an optical transmitter according to claim 7 coupled with the arrayed waveguide grating, wherein
the optical line terminal is configured to transmit a control signal to the optical transmitter, for adjusting the parameter of the fiber Bragg grating with tunable wavelength, the parameter representing the central wavelength of the fiber Bragg grating, the optical transmitter being configured to adjust the parameter of the fiber Bragg grating with tunable wavelength, according to the control signal.

* * * * *